United States Patent [19]

Murray et al.

[11] Patent Number: 5,440,246
[45] Date of Patent: Aug. 8, 1995

[54] PROGRAMMABLE CIRCUIT WITH FUSIBLE LATCH

[75] Inventors: Michael A. Murray; Li-Chun Li, both of Los Gatos; Hsing T. Tuan, Cupertino, all of Calif.

[73] Assignee: Mosel Vitelic, Incorporated, San Jose, Calif.

[21] Appl. No.: 216,208

[22] Filed: Mar. 22, 1994

[51] Int. Cl.$^6$ ............................. H03K 19/096
[52] U.S. Cl. ......................... 326/38; 326/121; 327/525; 365/96
[58] Field of Search ............... 307/202.1, 441, 443, 307/451, 469, 272.2; 365/96, 200; 326/38, 46, 121; 327/525

[56] References Cited

U.S. PATENT DOCUMENTS

| | | |
|---|---|---|
| 4,387,503 | 6/1983 | Aswell et al. . |
| 4,404,635 | 9/1983 | Flaker . |
| 4,532,607 | 7/1985 | Uchida ..................... 307/202.1 X |
| 4,546,455 | 10/1985 | Iwahashi et al. ................... 365/200 |
| 4,614,881 | 9/1986 | Yoshida et al. . |
| 4,617,651 | 10/1986 | Ip et al. . |
| 4,684,826 | 8/1987 | France et al. . |
| 4,725,979 | 2/1988 | Hoberman . |
| 4,771,285 | 9/1988 | Agrawal et al. . |
| 4,779,229 | 10/1988 | Agrawal . |
| 4,837,520 | 6/1989 | Golke et al. ...................... 307/441 X |
| 4,852,044 | 7/1989 | Turner et al. . |
| 4,943,804 | 7/1990 | Lee et al. . |
| 5,066,998 | 11/1991 | Fischer et al. . |
| 5,086,331 | 2/1992 | Hartgring et al. ............... 307/441 X |
| 5,134,585 | 7/1992 | Murakami et al. . |
| 5,185,291 | 2/1993 | Fischer et al. . |

FOREIGN PATENT DOCUMENTS 288689  10/1989  German Dem. Rep. .

OTHER PUBLICATIONS

Prince, Betty, *Semiconductor Memories*, 762–64 (1991) (U.S.A.).

Primary Examiner—David R. Hudspeth
Attorney, Agent, or Firm—Skjerven, Morrill, MacPherson, Franklin & Friel; Alan H. MacPherson

[57] ABSTRACT

A logical latch is permanently programmable to a selected state for use as a control circuit with extremely low power consumption in an integrated circuit.

3 Claims, 2 Drawing Sheets

PROGRAMMABLE CIRCUIT WITH FUSIBLE LATCH

FIELD OF THE INVENTION

This invention relates to a logical latch which is permanently programmable to one of two logical states for use in an integrated circuit.

BACKGROUND OF THE INVENTION

Semiconductor memory chips such as DRAMs commonly include both the memory itself and additional peripheral circuits to perform various functions.

Some types of peripheral circuits, such as redundancy circuits, are used primarily to increase the yield or reduce the cost of manufacturing the chips. Other types of peripheral circuits, such as mode control circuits, timing adjustment circuits, and logic change circuits, are used to modify or control the memory operation. For example, a timing adjustment circuit may be used to either reduce or increase the delay time of one signal with respect to a second signal, in order to provide for synchronous operation.

In fabricating integrated circuits such as DRAMs, it is often desirable to make design changes at a late stage in the fabrication process. While it is possible to redesign by changing the masks and reprocessing, such custom fabrication may be too expensive and time consuming especially if only a small quantity of chips is being produced. Another approach is, for example, to include alternative circuits in the original design and then use a control circuit to "select" one of the alternative circuits later in the fabrication process by using fuses to enable a selected circuit and disable a nonselected circuit.

As used in the prior art, such control circuits have the disadvantage of drawing power even in a nonselected state. It is therefore desirable to provide a programmable control circuit that draws essentially no power to selectively enable or disable such alternative circuits.

SUMMARY OF THE INVENTION

In accordance with the present invention, a programmable logical latch is used as a control circuit in an integrated circuit such as a DRAM memory chip to selectively enable or disable alternative peripheral circuits.

In one embodiment, a laser pulse is used to "open" (vaporize and remove) a portion of one or more existing conductive leads to set the programmable logical latch to one of two logical states. After it has been set to a particular logical state, the circuit remains in that state for the life of the circuit.

A programmable logical latch with complementary MOS transistors according to this invention has the advantage of consuming essentially no power in either the unprogrammed state (FIG. 1) or the programmed state (FIG. 2).

DETAILED DESCRIPTION

Figure 1:
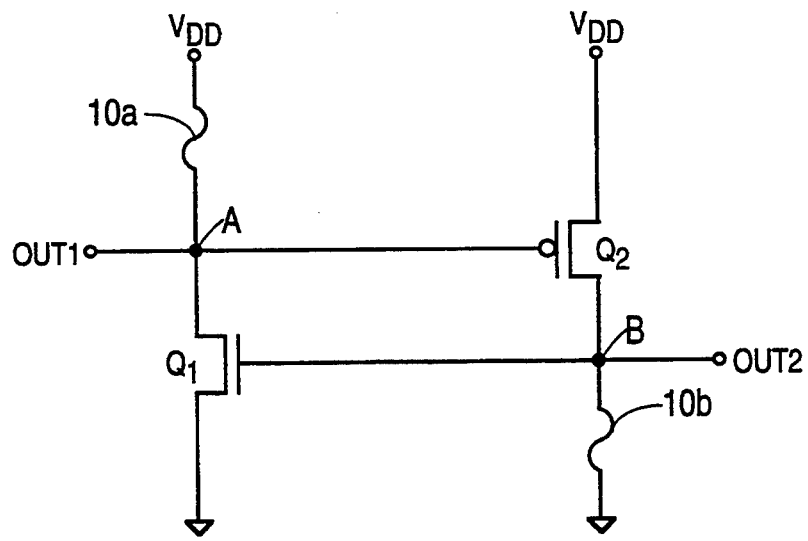
FIG. 1 is a circuit diagram of a programmable logical latch in accordance with this invention, before the latch is programmed (the fuses are intact).

FIG. 1 is a circuit diagram of a programmable logical latch in accordance with this invention, before the latch is programmed. The logical latch includes an NMOS transistor $Q_1$, a PMOS transistor $Q_2$, and fuses 10a and 10b. In one embodiment, fuses 10a and 10b are formed of polycrystalline silicon ("polysilicon"). As shown in FIG. 1, fuse 10a is formed between the drain of the NMOS transistor $Q_1$ and the supply voltage $V_{DD}$, and fuse 10b is formed between the drain of the PMOS transistor $Q_2$ and ground. As long as the fuses 10a and 10b are intact (not opened by a laser pulse, electrical pulse, or the like), the high voltage on node A turns PMOS transistor $Q_2$ off, and fuse 10b pulls node B low. The resulting low voltage at node B turns NMOS transistor $Q_1$ off, thereby allowing node A to remain high and reinforcing the state of the latch. Thus, the latch is set with the signal on output lead OUT1 high and the signal on output lead OUT2 low.

Figure 2:
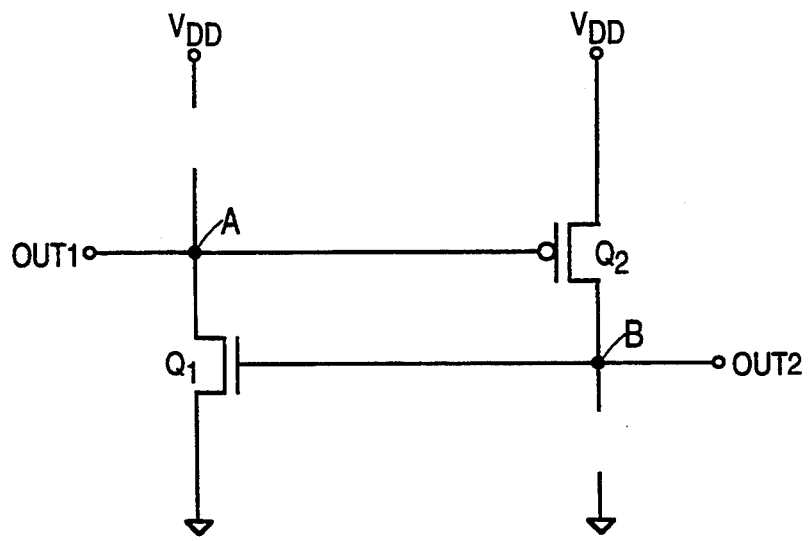
FIG. 2 is a circuit diagram of a programmable logical latch in accordance with this invention, after the latch has been programmed (the fuses have been opened).

FIG. 2 is a circuit diagram of the same programmable logical latch after the latch has been programmed (the fuses 10a and 10b have been opened). Before power is supplied to the circuit, both node A and node B are at zero volts. When the power is turned on, the low voltage at node A turns PMOS transistor $Q_2$ on, and transistor $Q_2$ pulls node B high. The resulting high voltage at node B turns transistor $Q_1$ on. When on, transistor $Q_1$ pulls node A low, reinforcing the state of the latch. The latch is then set with the signal on output lead OUT1 low and the signal on output lead OUT2 high. Therefore, the effect of opening fuses 10a and 10b is to reverse the logic states of the signals at output lead OUT1 and output lead OUT2.

In this embodiment, the fuses 10a and 10b are formed of polysilicon or another suitable material, and are opened by a laser pulse in a well-known process. Laser blown fuses are widely used in DRAM chips, since they occupy only a small area and require no extra logic on the chip for programming the fuses. Alternatively, the fuses 10a and 10b can be opened by an electrical pulse (which requires extra logic on the chip), a focused ion beam (which is currently more expensive than a laser beam), or any other suitable method.

Figure 3:
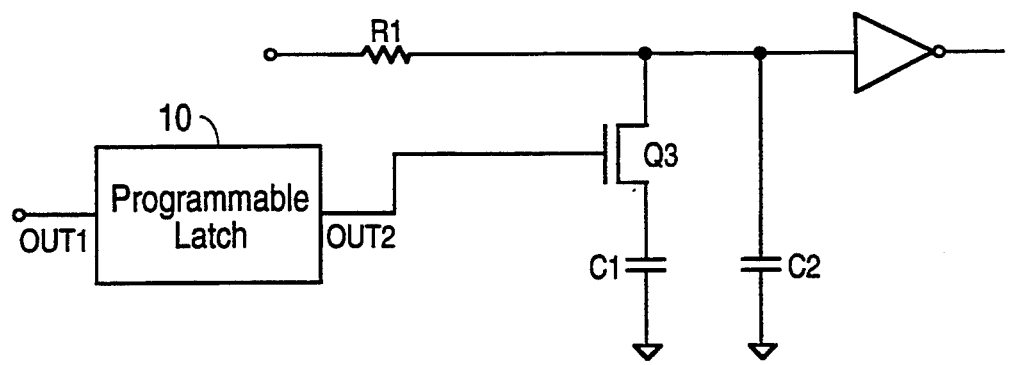
FIG. 3 is a block diagram of a programmable logical latch in accordance with this invention, used to adjust the delay time of a circuit.

In accordance with this invention, a programmable logical latch is used as a control circuit in an integrated circuit. In one embodiment, a programmable logical latch is used to adjust the delay time of a circuit as shown in FIG. 3, which could, for example, be on a DRAM chip. For example, the delay time of the circuit in FIG. 3 is adjusted by using the high output signal on lead OUT2 of the latch 10 of this invention (shown in detail in FIG. 2) to adjust the capacitance (and thus the delay) of the circuit by turning on MOS transistor $Q_3$ in series with capacitor C1 thereby to add capacitor C1 in parallel with capacitor C2. This increases the delay of the circuit.

Figure 4:
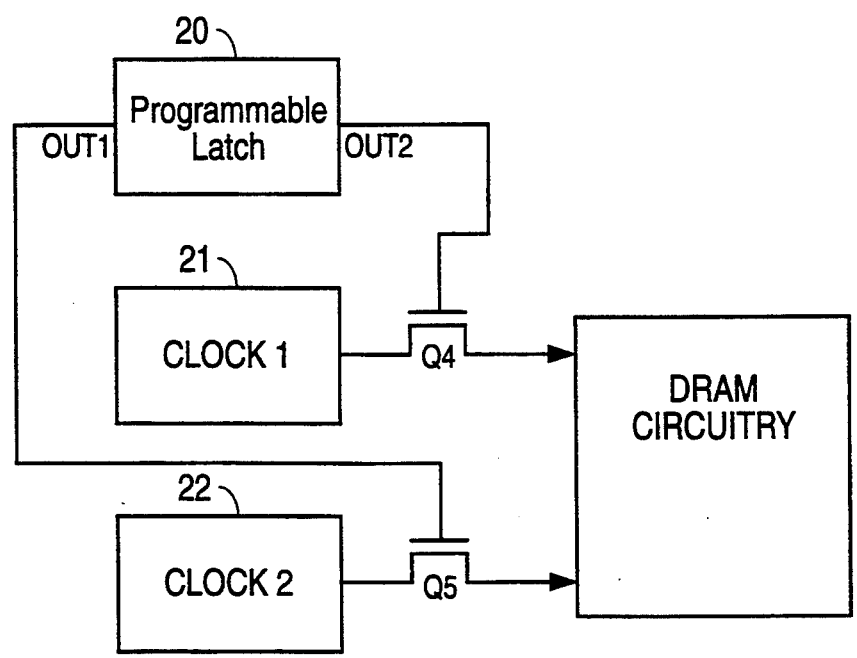
FIG. 4 is a block diagram of a programmable logical latch in accordance with this invention, used to change the circuit providing a clock signal.

In another embodiment, a programmable logical latch 20 (shown in detail in FIG. 2) is used to change the circuit providing a clock signal on a DRAM chip. For example, in FIG. 4, the high output signal on lead OUT2 of the latch 20 is used to select signal 1 as the output clock signal and disable signal 2 by turning on NMOS transistor Q4 in series with the clock signal from clock 1 while NMOS transistor Q5 in series with the clock signal from clock 2 is turned off by the low level signal on lead OUT1 from latch 20.

A control circuit using a programmable logical latch in accordance with this invention has significant advantages over using simple fuses to enable or disable circuits. For example, either the output signal on lead OUT1 or the output signal on lead OUT2 of the logical latch can control multiple switches in parallel, so that a single latch can enable or disable an entire block of circuitry. By contrast, it would be necessary to use numerous simple fuses to perform the same function. Moreover, a programmable logical latch according to this invention has the advantage of consuming essentially no power in either the unprogrammed state (FIG. 1) or the programmed state (FIG. 2).

It is to be understood that the above description is intended to be illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A programmable logical latch circuit for controlling another circuit, comprising:
   a first output lead and a second output lead;
   a first fuse having a first terminal coupled to a supply voltage terminal and a second terminal coupled to said first output lead;
   a first transistor of a first conductivity type having a first terminal coupled to said first output lead, a second terminal coupled to ground, and a gate coupled to said second output lead;
   a second fuse having a first terminal coupled to said second output lead and a second terminal coupled to ground; and
   a second transistor of a second conductivity type; having a first terminal coupled to said supply voltage terminal, a second terminal coupled to said second output lead, and a gate coupled to said first output lead;
   wherein said logical latch circuit, without any additional circuitry being required, is capable of assuming a first state if both said first and second fuses are intact and of assuming a second state if both said first and second fuses are opened.

2. A logical latch circuit as in claim 1 wherein said first and second fuses comprise polysilicon fuses which are capable of being open circuited by a laser pulse.

3. A logical latch circuit as in claim 2 wherein said first conductivity type comprises N-type conductivity and said second conductivity type comprises P-type conductivity.

* * * * *